United States Patent [19]

Feldmann

[11] 4,449,058

[45] May 15, 1984

[54] LOAD STATUS MONITORING APPARATUS
[75] Inventor: Daniel P. Feldmann, Melbourne, Fla.
[73] Assignee: Rockwell International Corporation, El Segundo, Calif.
[21] Appl. No.: 474,855
[22] Filed: Mar. 14, 1983
[51] Int. Cl.$^3$ .................. G01R 19/12; G01R 27/02
[52] U.S. Cl. ..................... 307/152; 324/62; 361/86
[58] Field of Search ............... 307/152; 324/51, 62; 361/86, 88; 330/107 P

[56] References Cited

U.S. PATENT DOCUMENTS 3,710,234 1/1973 Nakano ........................... 307/152
4,109,196 8/1978 Carmody ............................ 324/62
4,349,777 9/1982 Mitamura ....................... 324/62 X Primary Examiner—E. A. Goldberg
Assistant Examiner—Derek S. Jennings
Attorney, Agent, or Firm—Bruce C. Lutz; Robert C. Mayes; H. Fredrick Hamann

[57] ABSTRACT

It has been determined that if the level of the current input to a feedback stabilized driver amplifier circuit is compared with the level of the current output by the amplifier portion of this circuit, the ratio of the two currents is indicative of the condition of a load connected to the circuit. If the load comprises one or more impedances all of the same value, the ratio obtained will determine not only whether or not the load is open or short circuited but how many of the standard value loads are connected in parallel.

6 Claims, 1 Drawing Figure

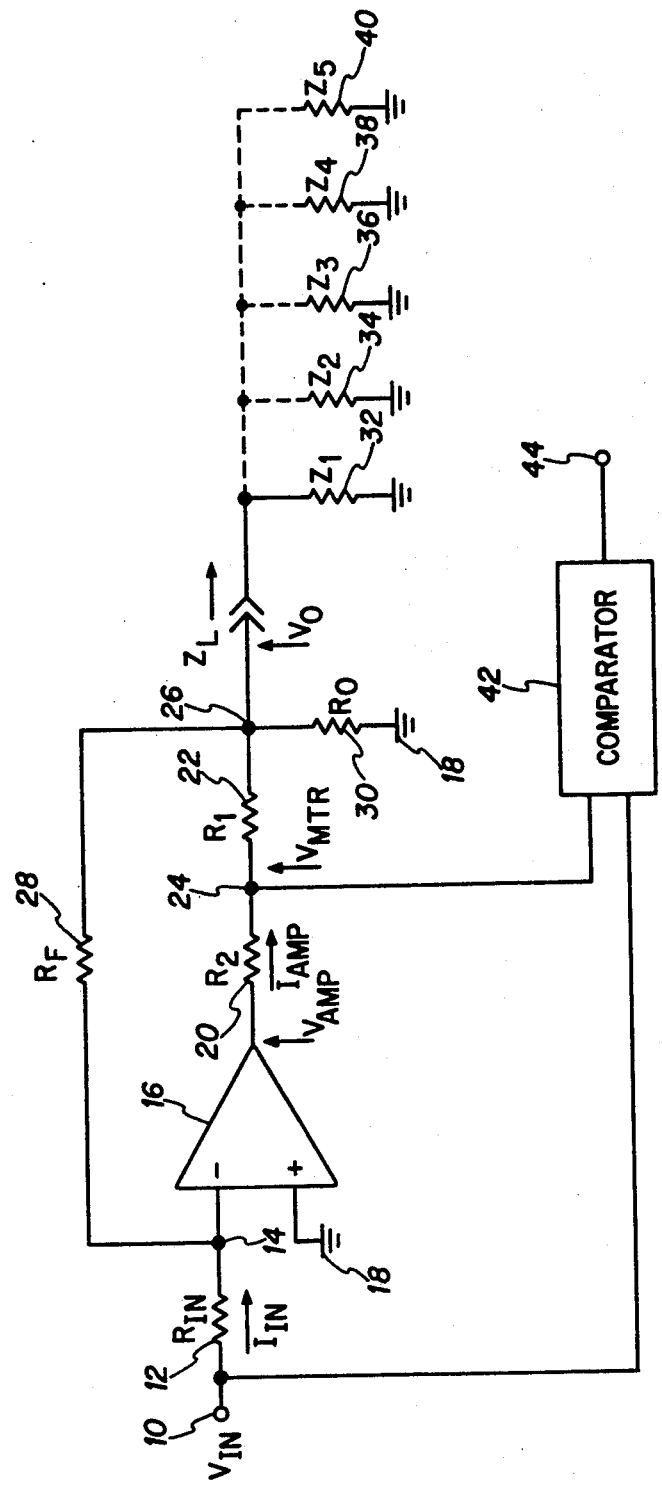

LOAD STATUS MONITORING APPARATUS

THE INVENTION

The present invention is generally concerned with electronics and more specifically with ascertaining the status of a load. Even more specifically, it is concerned with ascertaining the status of a load connected to a feedback stabilized amplifier driver circuit.

For certain types of applications, such as a deviation indicator in an airplane, it is helpful to know whether or not there is an open circuit or a short circuit between the driver amplifier circuit and the deviation meters themselves. The meter provides a deviation indication indicative of the amount that the airplane is off course. Also, normally there are a plurality of such meters in the cockpit of the airplane and can be as many as five separate meters all driven by the same deviation amplifier driver circuit. Thus, the amplifier per se is somewhat remote from some if not all of the meters. If there is a break in the line or the line becomes shorted to ground, the deviation meters all react identically and do not provide any deviation indication even though there may be a considerable deviation signal being supplied to the amplifier driver circuit. It is therefore highly desirable to have an indication when one or more of the meters is not receiving the appropriate input signal. There are times, such as upon installation of an additional meter to existing equipment, when it is useful information to be able to quickly ascertain that some of the meters are receiving the signal and some are not.

The present invention is based upon the realization that in a heavily stabilized feedback amplifier circuit, the ratio of the current being supplied to the amplifier circuit and the current output by the amplifier portion of the circuit is constant over a wide range of input voltages for a given load. However, this ratio changes or is dependent upon the load resistance. Thus, if this ratio of currents can be ascertained, a determination can be made as to whether the load is disconnected from the driver circuit by either a short or an open and the ratio can also provide adequate information so that a determination can be made as to how many loads are operably connected. In other words, if there are five meters and there is a break between the third and the fourth meter of five meters operably connected in parallel, the ratio of currents can be utilized to determine that there are, in fact, only three meters electrically connected to the driver circuit.

This ratio of currents is ascertained in one embodiment of the invention by measuring the voltage at the input side of the input resistor to the feedback stabilized circuit and adding two series connected resistances between the output of the amplifier and the output of the feedback stabilized driver circuit to develop a voltage which can be measured from ground to the point between the two series connected resistances.

It is therefore an object of the present invention to provide the method of and circuitry for monitoring the status of a load connected to a signal driving circuit.

Other objects and advantages of the present invention may be ascertained from a reading of the specification and appended claims in conjunction with the single sheet of drawing which illustrates one embodiment of the inventive concept.

DETAILED DESCRIPTION

In the drawing a terminal 10 is a signal supplying means for supplying signals through a resistor 12 to a junction point 14 which is connected to a negative or inverting input of an amplifier circuit 16 having its non-inverting input or positive terminal connected to ground 18. The voltage between terminal 10 and ground 18 is labeled as $V_{IN}$ and the current through resistor 12 is labeled $I_{IN}$. The resistor 12 is also provided the designation of $R_{IN}$ for the purposes of equations to be used later. An output of amplifier 16 is connected through a pair of resistors 20 and 22 with a junction point 24 intermediate the two resistors 20 and 22. Resistor 20 is additionally labeled $R_2$ while resistor 22 is labeled $R_1$. The voltage between junction point 24 and ground 18 is labeled $V_{MTR}$. The other end of resistor 22 is connected to a junction point 26. A feedback resistor multilabeled as $R_F$ and 28 is connected between junction points 14 and 26. A circuit output resistor 30 is connected between junction point 26 and ground 18. The components described thus far comprise a feedback stabilized driver amplifier circuit or signal driving means with the amplifier 16 being the amplifier portion thereof. The current through resistors 20 and 22 is labeled as $I_{AMP}$ for amplifier output current. There are a plurality of load resistors illustrated as 32, 34, 36, 38 and 40. The connection to resistors 34 through 40 is shown in dashed line configuration as optional resistors to be connected as a load. The impedance of the individual resistors are indicated as $Z_1$ through $Z_5$ and the total impedance connected is illustrated as $Z_L$ in the drawing. The output voltage at junction point 26 is labeled $V_o$.

A comparator circuit 42 is shown having two inputs connected to terminal 10 and junction point 24, respectively. Comparator 42 then provides a signal on an output lead culminating in terminal 44. It should also be noted that the output voltage of amplifier 16 is labeled $V_{AMP}$ as used in subsequent formulas.

OPERATION

Before describing the operation of the circuit, it is believed necessary to present a plurality of equations. It may be assumed that each of the resistors $Z_1$ through $Z_5$ is 1000 ohms. Thus, $Z_L$ will equal 200, 250, 333.3, 500 or 1000 ohms depending on how many of these load impedances are connected in parallel. Equation (1) below describes the impedance looking to the right from resistor 22 or, in other words, the output impedance as seen at junction point 26. This includes not only the load impedance $Z_L$ but the impedance of output resistor 30 and the feedback impedance of resistor 28.

$$R_L = 1/(1/R_F + 1/R_o + 1/Z_L) \tag{1}$$

The output voltage at junction point 26 is described by Equation (2) below in terms of the feedback impedance of resistor 28 and the input impedance of resistor 12. For the values given, the voltage gain of the circuit is $-0.1$, or in other words, the output voltage is 1/10th of the input voltage. This voltage gain ratio in a feedback amplifier indicates a very highly stabilized amplifier if the voltage gain through amplifier 16 itself is fairly high.

$$V_o = (-V_{IN} R_F)/R_{IN} = -0.1 \, V_{IN} \tag{2}$$

Since effectively the resistance $R_L$, as obtained in Equation (1), is in series with the resistors $R_1$ and $R_2$, these resistors must equal the voltage divided by the current at the output of amplifier 16. This is presented in Equation (3).

$$R_L + R_1 + R_2 = V_{AMP}/I_{AMP} \qquad (3)$$

The output voltage at junction point 26 may also be described in terms of the current out of the amplifier and the resistance $R_L$ as described in Equation (1). This is presented in the following Equation (4).

$$V_o = (I_{AMP})(R_L) \qquad (4)$$

The voltage at junction point 24 is presented in alternative forms in Equations (5) and (6) following.

$$V_{MTR} = (I_{AMP})(R_L + R_1) \qquad (5)$$

$$V_{MTR} = (I_{AMP})(R_1) + V_o \qquad (6)$$

In one embodiment of the inventive concept, as reduced to practice, the amplifier 16 is capable of providing an output of ±8 volts DC at a current output of ±8 milliamps minimum. For the purposes of deriving further formulas, it may be assumed that the current $I_{AMP}$ is 8 milliamps when the voltage IN at terminal 10 is −3 volts DC. From Equation (2) we will then determine that the voltage at junction point 26 is 0.3 volts DC. If the assumed values of 8 volts DC at the output of amplifier 16 with 8 milliamps current is inserted in Equation (3), the total resistance of resistors $R_L$, $R_1$ and $R_2$ would be 1000 as shown in Equation (7).

$$R_L + R_1 + R_2 = 8 \text{ V}/0.008 = 1000 \qquad (7)$$

Using the material assumed and derived above, Equation (4) can be rewritten in the form of Equation (8) below where the resistance $R_L$ is determined to be 37.5 ohms.

$$R_L = V/I_{AMP} = 0.3/0.008 = 37.5 \text{ ohms} \qquad (8)$$

For the purposes of this discussion, it may be assumed that the voltage at junction point 24 is equal to the inverse of the voltage at terminal 10. Using these assumptions with Equation (5), will result in a determination that the resistance $R_1$ will be 337.5 ohms.

$$R_1 = 337.5 \text{ ohms} \qquad (9)$$

If the values above are substituted in Equation (7), the value of $R_2$ can be solved and found to be 625 ohms.

It may now be assumed that three deviation meters represented by $Z_1$ through $Z_3$ comprise normal operation. Under this condition, $Z_L$ would equal 333.3 ohms. If these values are substituted into Equation (1), the following Equations (10) and (11) will be obtained and it will be found that the resistance 30 needs to be 42.6 to conform to the assumed conditions.

$$37.5 = 1/(1/4990 + 1/R_o + 1/333.3) \qquad (10)$$

$$R_o = 42.6 \text{ ohms} \qquad (11)$$

If standard one percent parts are used for resistors 30, 22 and 20, these values may be respectively 42.2 ohms, 340 ohms and 619 ohms.

The amplifier driver circuit may be reevaluated wherein the load is assumed to be only a single resistor such as $Z_1$ or resistor 32. Using the equations above, it will be shown that the voltage at junction point 24 has changed by 5.4 percent if one volt remains at input terminal 10. Since the voltage is developed due to the amplitude of the current flowing through resistors 20 and 22, the results are really showing that the current output by amplifier 16 is somewhat less with fewer load impedances. The reevaluation of the circuit operation with one load is presented in Equations (12) through (17).

| | |
|---|---|
| When $Z_L = 1000$ ohms (1 load) | (12) |
| $R_L = 40.2$ Ohms (Equation 1) | (13) |
| Let $V_{IN} = -1.0$ VDC | (14) |
| $V_o = 0.1$ V (Equation 2) | (15) |
| $I_{AMP} = V_o/R_L = 0.1/40.2 = 2.49$ mA | (16) |
| $V_{MTR} = (I_{AMP})(R_1) + V_o = 0.849 + 0.1 = 0.946$ volts (Equation 6) | (17) |

It may now be assumed that the load comprises the entire set of resistors $Z_1$ through $Z_5$. An evaluation of the voltage at junction point 24 under these conditions is presented in Equations (18) through (23) to show that the current has increased since the voltage at junction point 24 has increased over the standard assumed three loads by 8.3 percent.

| | |
|---|---|
| When $Z_L = 200$ ohms (5 loads) | (18) |
| $R_L = 34.6$ ohms (Equation 1) | (19) |
| Let $V_{IN} = -1.0$ VDC | (20) |
| $V_o = 0.1$ V (Equation 2) | (21) |
| $I_{AMP} = 0.1/34.6 = 2.89$ mA | (22) |
| $V_{MTR} = 1.083$ VDC (Equation 6) | (23) |

A further evaluation of the circuit under the conditions of $Z_L$ being infinity, or in other words, an open circuit condition is provided by the following Equations (24) through (29). This shows that the current output by the amplifier decreases by about 8.7 percent over the standard assumed value of three connected load resistors.

| | |
|---|---|
| When $Z_L =$ open circuit | (24) |
| $R_L = 41.8$ ohms (Equation 1) | (25) |
| Let $V_{IN} = -1.0$ VDC | (26) |
| $V_o = 0.1$ V (Equation 2) | (27) |
| $I_{AMP} = 0.1/41.8 = 2.39$ mA | (28) |
| $V_{MTR} = 0.913$ V (Equation 6) | (29) |

If the output is altered so that there is a short between junction point 26 and ground 18, the voltage at junction point 24 will be the positive or negative maximum available when amplifier 16 is turned fully ON except when the voltage at junction point or terminal 10 is *exactly* zero. Under these conditions, junction point 24 could theoretically be zero volts.

Since the driver circuit is a very stable device with the amount of feedback shown, the ratio of the voltage between terminal 10 and junction point 24 will remain constant for a given load condition. By continually checking the ratio of these two voltages, "faults," such as shorted or open lines to the load, can be detected. Further, the actual number of loads connected can be ascertained with the appropriate detection circuitry. Such voltages are, in actuality, a detection of relative currents flowing in at terminal 10 and through resistor 22 as output by amplifier 16. Thus, any detection circuit which is capable of comparing the ratio of these currents may also be used. A comparator amplifier shown as 42 can be used to measure the relative currents and if the hysteresis in this comparator is appropriate, an output may be provided on lead 44 whenever the ratio range falls outside prescribed limits. In other words, when the ratio is very much less than the 0.946 value for a single load or is much greater than the 1.083 ratio obtained with five parallel connected loads. If the detection circuitry is sufficiently sophisticated, such as may be obtained through voltage measuring devices supplying signals to a microprocessor, additional information such as actual number of load impedances connected may also be output to the appropriate error panel when the initial value changes during circuit operation.

While I have described a single embodiment of the inventive concept of checking the current IN to a driver feedback stabilized circuit and comparing this current with that output by the amplifier section of the driver circuit to ascertain the status of a load, I wish to be limited not by the single embodiment shown or the various approaches to detecting the ratio of these currents discussed, but only by the scope of the appended claims wherein I claim.

I claim:

1. The method of monitoring the loading of a feedback amplifier circuit having an amplifier, apparatus input and output terminal means and feedback resistance means providing feedback from said output terminal means to an input of the amplifier comprising the steps of:
   adding monitor resistance means between the output of the amplifier and the apparatus output terminal means wherein said monitor resistance means includes voltage monitor terminal means located at an intermediate point; and
   comparing the ratio of voltages appearing at said apparatus input and monitor terminal means as an indication of loading faults.

2. Apparatus for monitoring the status of a load comprising, in combination:
   amplifier means including input means and output means;
   apparatus input means for supplying signals through an input resistance to said input means of said amplifier means;
   apparatus output means;
   feedback resistance means connected between said apparatus output means and said input means of said amplifier means for maintaining a constant voltage gain between said apparatus input means and said apparatus output means;
   first and second monitor resistance means connected in series between said output means of said amplifier means and said apparatus output means and including monitor terminal means intermediate said monitor resistance means; and
   comparator means, connected to said apparatus input means and said monitor terminal means, for providing an output signal indicative of an error condition when the ratio of signal voltages receive deviates outside a predetermined range of values.

3. Apparatus as claimed in claim 2 comprising, in addition:
   load means comprising at least one load element wherein the comparator means can provide an indication in the alternative of how many load elements are connected, whether there is a short circuit or whether there is an open circuit.

4. The method of monitoring the status of a load circuit connected to the output of a feedback stabilized driver amplifier circuit including circuit input means and circuit output means comprising the steps of:
   detecting the level of current input to the feedback stabilized driver amplifier circuit;
   detecting the level of current output by the amplifier portion of the feedback stabilized driver amplifier circuit;
   comparing the relative current levels detected; and
   outputting a signal, based upon the comparison, indicative of the status of said load circuit of said feedback stabilized driver amplifier circuit.

5. Apparatus for monitoring the status of a load circuit connected to the output of a feedback stabilized driver amplifier circuit including circuit input means and circuit output means comprising, in combination:
   first means for detecting the level of current input to the feedback stabilized driver amplifier circuit;
   second means for detecting the level of current output by the amplifier portion of the feedback stabilized driver amplifier circuit;
   third means, connected to said first and second means, for comparing the relative current levels detected; and
   fourth means for outputting a signal from said third means, based upon the ratio obtained in the comparison by said third means, indicative of the status of the load circuit of said feedback stabilized driver amplifier circuit.

6. The method of monitoring the status of a load circuit connected to the output of a feedback stabilized driver amplifier circuit including circuit input means and circuit output means comprising the steps of:
   detecting the level of current input to the feedback stabilized driver amplifier circuit;
   detecting the level of current output by the amplifier portion of the feedback stabilized driver amplifier circuit; and
   outputting a signal, based upon the ratio of detected current levels, indicative of the status of the load circuit of said feedback stabilized driver amplifier circuit.

* * * * *